US006836106B1

(12) United States Patent
Brelsford et al.

(10) Patent No.: US 6,836,106 B1
(45) Date of Patent: Dec. 28, 2004

(54) APPARATUS AND METHOD FOR TESTING SEMICONDUCTORS

(75) Inventors: Kevin H. Brelsford, Cambridge, MA (US); Ronald G. Filippi, Jr., Wappingers Falls, NY (US); Kenneth P. Rodbell, Sandy Hook, CT (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/668,561

(22) Filed: Sep. 23, 2003

(51) Int. Cl.[7] .............................................. G01R 31/26
(52) U.S. Cl. ..................... 324/100; 324/763; 324/765
(58) Field of Search ............................... 324/73.1, 72.5, 324/100, 500, 537, 763, 765, 158.1; 714/724–725, 733; 257/40, 48, 207–209; 438/17–19

(56) References Cited

U.S. PATENT DOCUMENTS

| | | | |
|---|---|---|---|
| 4,516,071 A | | 5/1985 | Buehler |
| 4,725,773 A | * | 2/1988 | Lieneweg ................... 324/73.1 |
| 5,351,213 A | * | 9/1994 | Nakashima .................. 365/201 |
| 5,400,343 A | | 3/1995 | Crittenden et al. |
| 5,552,718 A | | 9/1996 | Bruce et al. |
| 5,578,932 A | | 11/1996 | Adamian |
| 6,621,289 B1 | * | 9/2003 | Voogel ........................ 324/765 |

* cited by examiner

Primary Examiner—Minh N. Tang
(74) Attorney, Agent, or Firm—Robert M. Trepp; Ryan, Mason & Lewis, LLP

(57) ABSTRACT

A test circuit for testing semiconductors includes a plurality of at least first conductors and second conductors. The first and second conductors are operatively connected together by a plurality of conductive vias to form an open chain of alternating first and second conductors. A plurality of conductive taps are included, each of the taps being connected at a first end to a corresponding first conductor. The test circuit further includes a plurality of switching circuits, each of the switching circuits being operatively connected to a second end of a corresponding one of the conductive taps. Each of the switching circuits is configurable for selectively connecting the corresponding conductive tap to one of at least a first bus and a second bus in response to at least one control signal presented to the switching circuit, the first and second buses being connected to first and second bond pads, respectively.

24 Claims, 3 Drawing Sheets

APPARATUS AND METHOD FOR TESTING SEMICONDUCTORS

FIELD OF THE INVENTION

The present invention relates generally to semiconductor testing, and more particularly relates to techniques for obtaining improved accuracy and resolution from semiconductor test structures.

BACKGROUND OF THE INVENTION

In order to facilitate the testing of integrated circuit (IC) devices, such as back-end-of-line (BEOL) testing, test structures are typically formed in the IC using a conventional semiconductor fabrication process. Traditionally, these BEOL test structures, for mechanical integrity tests as well as electromigration or stress-induced voiding tests, employ open-ended chains of alternating metal levels. The testing of BEOL test structures is generally limited by the number of available bond pads that can be tied to points on the physical structure.

Electromigration is the migration of metal ions (e.g., aluminum) in a conductor due to electrical current stress. At flux divergence sites, electromigration can give rise to voids and hillocks, which eventually can cause open or short circuit failure. Stress-induced voiding also can result in open circuit failure. In this case, however, the driving force is not the current but the high triaxial tensile stress in the encapsulated metal lines after processing. Both electromigration and stress-induced voiding are reliability degrading mechanisms that become more and more critical as dimensions reduce. Consequently, obtaining accurate testing data is a primary objective in order to improve the reliability of IC designs.

One problem with conventional testing methodologies, however, is that multiple failures deep within the BEOL test structure itself cannot be readily detected. For example, FIG. 1 illustrates a conventional thermal cycle test structure designed as a chain of alternating lower metal conductors 102 and upper metal conductors 104 connected by conductive vias 106 to examine the mechanical integrity between different levels of metal. Taps, namely, Tap1 and Tap2, to the test structure are made at the ends of the chain and, as such, an electrical test between the two taps will only indicate that an open circuit has occurred somewhere within the structure. However, details such as where the failure occurred or how many failures exist in the chain remain unknown. Additionally, the precise location of voiding is often not known unless a destructive failure analysis technique, such as, for example, electron beam induced current (EBIC), is employed.

There exists a need, therefore, in the field of semiconductor testing, for a nondestructive testing methodology that is capable of improving the accuracy and resolution of testing data obtained from semiconductor test structures.

SUMMARY OF THE INVENTION

The present invention provides techniques for obtaining improved accuracy and resolution from semiconductor test structures by removing the limit imposed by the number of bond pads associated with a semiconductor device. The invention, in one aspect, utilizes digital technology to allow taps on chain-type test structures at every link in the chain. In this manner, the testing methodology of the present invention is limited only by the number of bits available for addressing and/or the physical space available for the test structure.

In accordance with one embodiment of the invention, a semiconductor test circuit includes a plurality of at least first conductors and second conductors. The first and second conductors are operatively connected together by a plurality of conductive vias to form an open chain of alternating first and second conductors. A plurality of conductive taps are included, each of the taps being connected at a first end to a corresponding first conductor. The test circuit further includes a plurality of switching circuits, each of the switching circuits being operatively connected to a second end of a corresponding one of the conductive taps. Each of the switching circuits is configurable for selectively connecting the corresponding conductive tap to one of at least a first bus and a second bus in response to at least one control signal presented to the switching circuit, the first and second buses being connected to first and second bond pads, respectively.

In accordance with a preferred embodiment of the invention, the test circuit may further include a decoder operatively coupled to the switching circuits. The decoder is configurable to generate the at least one control signal for selectively accessing one or more of the plurality of first and second conductors in the chain. In this manner, the present invention advantageously increases the data resolution that may be obtained from the test structure for a given number of bond pads.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described herein in the context of an illustrative chain-type semiconductor test structure fabricated using a metal-oxide-semiconductor (MOS) process technology. It should be appreciated, however, that the present invention is not limited to this or any particular test structure and/or process technology. Rather, the invention is more generally applicable to a semiconductor test structure and methodology for obtaining improved testing data from the semiconductor test structure. Moreover, although implementations of the present invention are described herein using MOS devices, it should be appreciated that the invention is not limited to such devices, and that other suitable devices, such as, for example, bipolar junction transistor (BJT) devices, may be similarly employed, with or without modifications to the inventive test structure, as will be understood by those skilled in the art.

Figure 1:
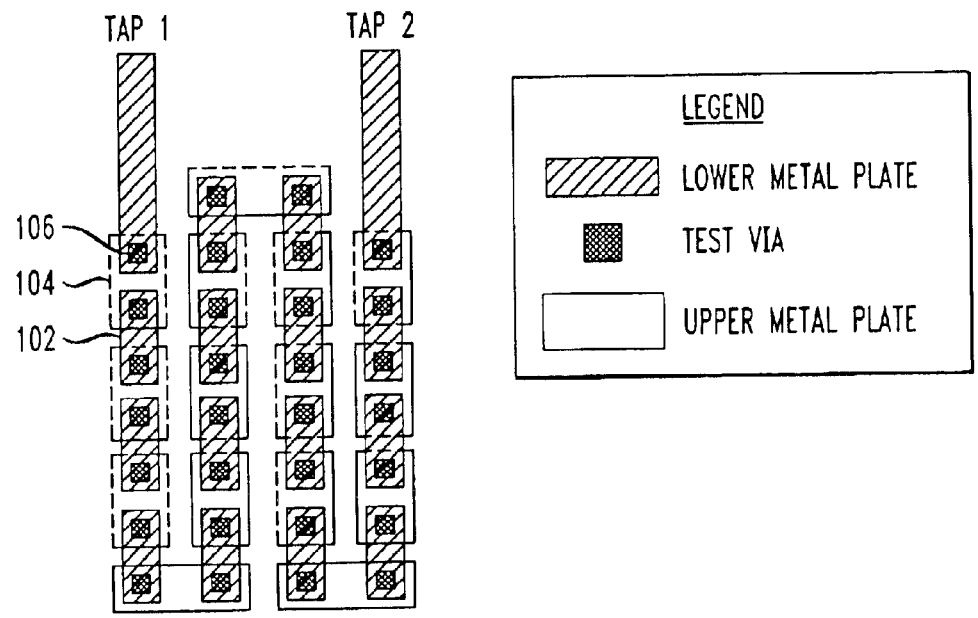
FIG. 1 is a conventional chain-type semiconductor test structure.

As previously stated, a disadvantage of conventional open-ended chain-type semiconductor test structures is that the precise location of an open circuit occurring somewhere in the chain cannot be easily determined since, due in part to limitations in the number of available bond pads, the chain is typically only tapped at the open ends of the chain, as shown in FIG. 1. Instead, the location of an electrically open unit (i.e., link) in the chain structure is traditionally identified using an EBIC technique under a scanning electron microscope. As is known by those skilled in the art, this technique involves scanning an electron beam over the entire chain structure while electrons injected in the metal chain are tapped out as an electrical current at the ends of the chain. An EBIC image of the chain structure can thus be constructed based on the electrical current collected during the scanning of the electron beam over the structure. A discontinuity in the EBIC contrast indicates the location of the electrically open unit in the test structure.

There are several disadvantages in using this conventional testing approach. For example, if multiple failures exist it is typically only possible to detect, at most, the first and last failure units in the chain. Any additional failures deeper in the chain cannot be identified. Consequently, the test resolution and sample size are significantly reduced. Furthermore, the EBIC technique is a destructive, costly and time-consuming methodology, and is therefore undesirable.

Figure 2:
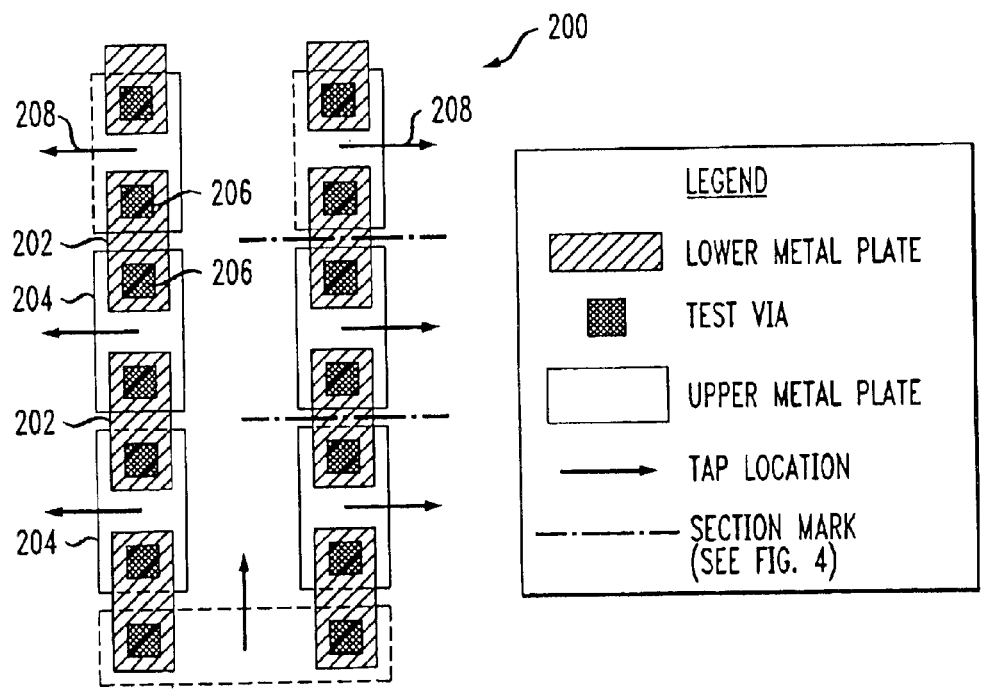
FIG. 2 is at least a portion of an exemplary test structure in which the techniques of the present invention may be implemented.

FIG. 2 illustrates at least a portion of an exemplary test structure 200, formed in accordance with one aspect of the invention. The test structure includes alternating sections (i.e., units) of lower conductive plates 202 and upper conductive plates 204 connected together by conductive vias 206. The terms "lower" and "upper" as used herein are intended to refer to the relative positions of the alternating sections in relation to one another, such that, when viewed in cross-section, the upper conductive plate is formed above the lower conductive plate on a semiconductor wafer. An insulating layer (e.g., silicon dioxide), or other substantially nonconductive layer, may be formed between the two conductive layers such that the two levels of conductive plates are not electrically connected to one another, hence the need for a conductive via to make an electrical connection from one conductive plate to another.

The conductive plates 202, 204 used to form the alternating sections preferably comprise a metal, such as, for example, aluminum, gold, copper, etc., although the invention is not limited to the type of conductive material used. Likewise, the vias 206 are preferably formed using an electrically conductive material, such as, but not limited to, aluminum, gold, copper or tungsten. For ease of explanation, only two levels of conductive plates are used to form the exemplary test structure 200. However, it is to be appreciated that the techniques of the present invention described herein may be readily expanded to form a test structure comprising more than two levels of alternating conductive plates, as will be understood by those skilled in the art.

The exemplary test structure 200 further comprises a plurality of taps 208 formed at substantially every other section (e.g., upper conductive plates) in the chain-type test structure. The taps 208 may comprise essentially any conductive material, and are preferably comprised of metal (e.g., aluminum, gold, etc.). As will be described in further detail below, the taps 208 are operatively coupled to switches (not shown), which may be implemented using pass transistors, to select any point in the chain and connect it to a bus. The bus is preferably connected to a bond pad which can then be tapped to allow external access to selected points in the chain. The points in the chain which can be accessed by the bond pads are controlled by selectively enabling the switches.

In accordance with one aspect of the invention, a matrix addressing technique is utilized to detect substantially all failures in a given test structure, and thereby obtain significantly more detailed comparisons among semiconductor wafers. The matrix addressing techniques of the present invention thus exploit the use of digital technology to advantageously improve semiconducting testing data by removing the limit imposed by the number of bond pads in conventional testing approaches. The matrix addressing technique is essentially limited only by the number of bits available for addressing and by the physical space available for the test structure itself.

Figure 3:
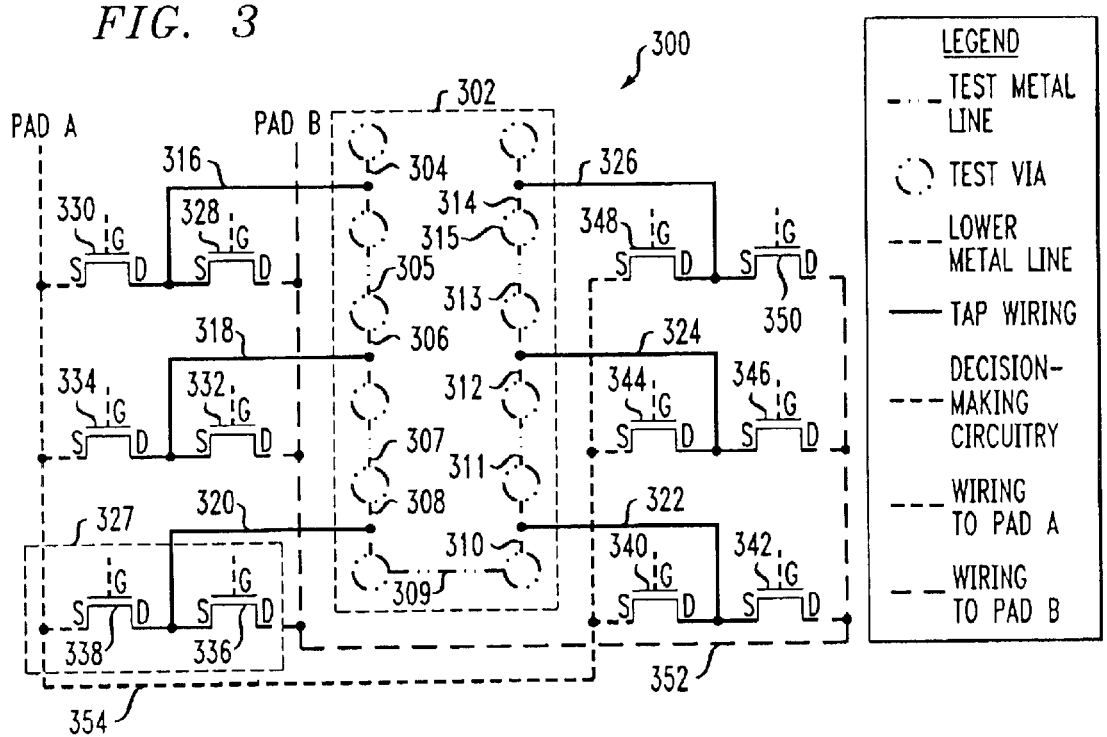
FIG. 3 is a schematic diagram illustrating at least a portion of an exemplary test circuit, formed in accordance with one embodiment of the invention.

FIG. 3 is a schematic diagram illustrating at least a portion of an exemplary test circuit 300 in which the techniques of the present invention are implemented. The exemplary test circuit 300 includes a chain-type test structure 302, which may be similar to the test structure depicted in FIG. 2, and matrix addressing circuitry for selectively accessing individual points in the chain. The test structure 302 comprises a plurality of alternating lower metal lines 305, 307, 309, 311 and 313 and upper (i.e., test) metal lines 304, 306, 308, 310, 312 and 314 connected in a series chain by a plurality of vias 315, with each of the vias connecting a lower metal line to an upper metal line. Although the addressing circuitry employed in the test circuit 300 may reside external to the test structure (e.g., in a separate address circuit), in order to reduce the amount of interconnect wiring required between the test structure 302 and the addressing circuitry, at least a portion of the addressing circuitry may be integrated within the test structure itself, in accordance with a preferred embodiment of the invention.

The matrix addressing circuitry included in the exemplary test circuit 300 preferably comprises a plurality of switching circuits, of which switching circuit 327 is representative, each of the switching circuits being operatively coupled to a corresponding metal line in the chain test structure 302. Each switching circuit 327 preferably includes a pair of switches 328 and 330, 332 and 334, 336 and 338, 340 and 342, 344 and 346, and 348 and 350. One or more of the switches may be implemented as MOS pass transistors or as alternative switching elements and/or circuits (e.g., BJT, multiplexer, etc.). Each of the pass transistors preferably includes a gate (G), a drain terminal (D) and a source terminal (S), and functions such that a relatively low-resistance (e.g., less than about one ohm) electrical path is formed between the drain and source terminals in response to a voltage, that is greater than or equal to a threshold voltage associated with the transistor, applied to the gate.

It is to be appreciated that, in the case of a simple MOS device, because the MOS device is symmetrical in nature, and thus bi-directional, the assignment of source and drain designations in the MOS device is essentially arbitrary. Therefore, the source and drain regions may be referred to generally as first and second source/drain regions, respectively. The term "source/drain terminal" as used herein is intended to include, without limitation, a source terminal or a drain terminal.

The test circuit 300 further includes a plurality of conductive taps (e.g., aluminum, gold, etc.) 316, 318, 320, 322, 324 and 326, each of the taps being connected at a first end to a corresponding upper metal line 304, 306, 308, 310, 312 and 314, respectively, in the test structure 302. Test circuit 300 is preferably configured such that a second end of each of the taps is selectively couplable to either a first bus 354, which may be connected to a first bond pad (Pad A), or a second bus 352, which may be connected to a second bond pad (Pad B), by way of a corresponding pair of series connected pass transistors. Each pair of transistors is preferably configured so that the source terminal of a first one of the transistors is coupled to the first bus, the drain terminal of the first transistor is connected to the source terminal of a second one of the transistors, and the drain terminal of the second transistor is connected to the second bus. The junction of the first and second transistors is connected to the second end of a corresponding tap.

By way of example only, the source terminal of transistor 330 is connected to bus 354, the drain terminal of transistor 330 is connected to the source terminal of transistor 328, and the drain terminal of transistor 328 is connected to bus 352. The node connecting transistors 328 and 330 is connected to upper metal line 304 via tap 316. Likewise, the source terminal of transistor 334 is connected to bus 354, the drain terminal of transistor 334 is connected to the source terminal of transistor 332, and the drain terminal of transistor 332 is connected to bus 352. The node connecting transistors 332 and 334 is connected to upper metal line 306 via tap 318. The same holds true for the remaining transistors in the exemplary test circuit 300. Alternative connection arrangements are similarly contemplated by the invention.

In order to test one of the units, such as lower metal line 305, in the test structure 302, the two adjacent taps 316, 318 are accessed. Thus, assuming the pass transistors are all n-type MOS (NMOS) devices, if a current is sourced on bus 354 via Pad A and returned on bus 352 via Pad B, transistor 330 is enabled and transistor 328 is concurrently disabled, such as by applying a logic high signal, which may be the positive voltage supply (e.g., VDD), to the gate of transistor 330 and a logic low signal, which may be the negative voltage supply (e.g., VSS), to the gate of transistor 328. Substantially simultaneously, transistor 332 may be enabled and transistor 334 may be disabled, such as by applying a logic high signal to the gate of transistor 332 and a logic low signal to the gate of transistor 334. In this manner, an electrical connection path is formed from Pad A to Pad B including bus 354, transistor 330, tap 316, metal line 304, metal line 305, metal line 306, tap 318, transistor 332, and bus 352. In order to prevent electrically shorting buses 352 and 354 together, it is important that only one of the transistors in a transistor pair corresponding to a given tap is enabled during any particular time.

The pass transistors in the test circuit 300 are preferably addressable through address lines (not shown), each of the address lines being coupled to a gate of a corresponding pass transistor at a first end and either directly to a bond pad or to an address decoder (not shown) at a second end, the former being a simpler configuration compared to the latter. Address decoders suitable for use with the present invention may comprise, for example, at least one multiplexer. In a preferred embodiment of the invention, the address decoder comprises one or more column and/or row multiplexers (not shown).

As is known by those skilled in the art, a multiplexer is a circuit which allows the selection of one of several inputs as specified by a control signal, typically a digital control signal. A typical multiplexer or address decoder may comprise a plurality of MOS transistors operatively configured as logic gates which, together, are capable of selecting any one of several input signals. The control signal presented to the multiplexer selects which one of the logic gates is activated, and thus determines which of the pass transistors in the test circuit 300 is addressed. One application, for instance, might involve a data acquisition system in which a number of input voltages are to be sampled and/or recorded.

By employing an address decoder to selectively enable the pass transistors rather than directly connecting the gates of the pass transistors to separate corresponding bond pads, the data resolution obtained from the test structure can be increased from two points to $2^N$ points, where N is the total number of bond pads available for addressing. Therefore, each section in the test structure can be probed electrically, significantly increasing the sample size and resolution of the test structure and beneficially allowing a more detailed comparison among wafers. Furthermore, this testing methodology of the present invention is configurable for providing resistance verses time characterization of each individual section of the test structure, thereby enabling one to pinpoint, both for individual test sites and statistically for multiple test sites, a weak link or links in a particular test structure.

Figure 4:
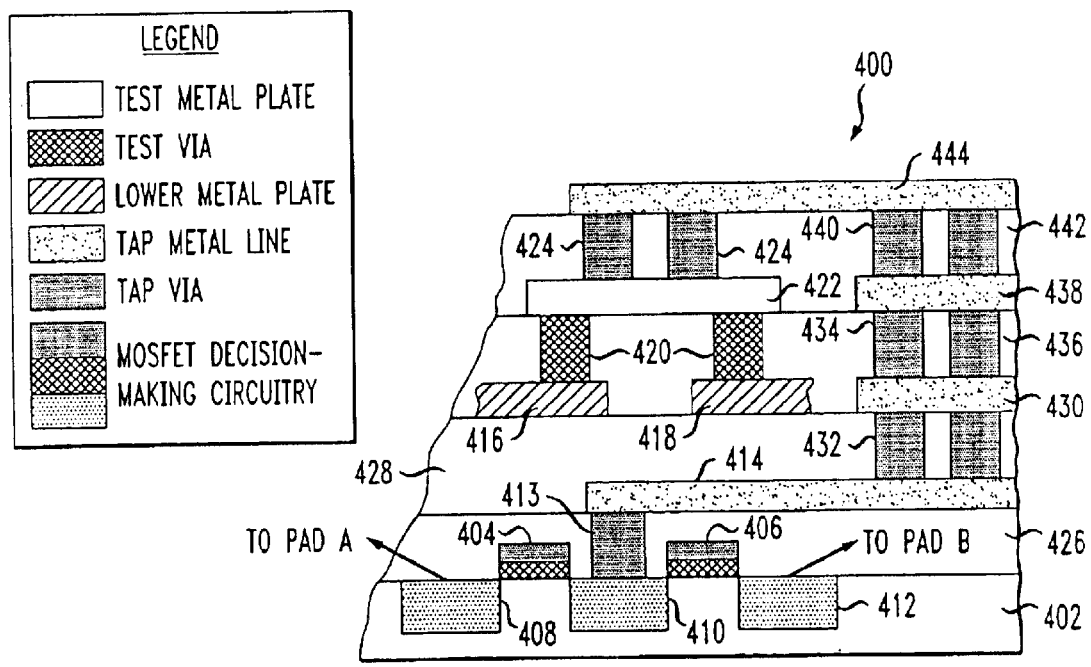
FIG. 4 is a cross-sectional view of a semiconductor wafer illustrating at least a portion of one section of the exemplary test structure shown in FIG. 3, in accordance with the present invention.

FIG. 4 is a cross-section of at least a portion of an exemplary semiconductor wafer 400 illustrating an individual section of the test circuit 300 shown in FIG. 3, formed on a semiconductor substrate 402, in accordance with the present invention. It is to be appreciated that the various layers and/or regions shown in the figure may not be drawn to scale. Furthermore, for ease of explanation, one or more layers of the exemplary wafer may have been intentionally omitted (e.g., metal contact layer), as will be understood by those skilled in the art.

The term "substrate" as used herein refers to any material upon which other materials may be formed. The semiconductor wafer 400 comprises the substrate 402, with or without an epitaxial layer, and preferably includes one or more other layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which a circuit element may be formed.

As previously stated, the addressing circuitry, which in this case comprises a corresponding pair of pass transistors for each of the taps, can be integrated locally with each of the sections of the test structure. For example, a given section of the test structure may comprise an upper conductive plate 422, which may be analogous to the upper conductive plate 306 (see FIG. 3) connected to lower conductive plates 416 and 418, which may be analogous to lower conductive plates 305 and 307, respectively (see FIG. 3), by way of conductive vias 420, which may be analogous to vias 315 (see FIG. 3). The section further comprises a pair of pass transistors, which may be analogous to transistors 332 and 334 (see FIG. 3), a first one of the transistors including a source region 408, a drain region 410 and a gate 404 and a second one of the transistors including a source region 410, which essentially shares the same active region as the drain region of the first transistor, a drain region 412 and a gate 406. An insulating layer 426, which may comprise silicon dioxide ($SiO_2$) is formed substantially over the transistors, thereby enabling the lower conductive plates 416, 418 and upper conductive plate 422 to be formed above at least a portion of the transistors without electrically shorting the transistors together or to other circuit elements.

After forming the insulating layer 426, a conductive via 413 is formed through the insulating layer, such as, for example, using a conventional etching process to expose the drain/source region 410 and then filling the opening with metal (e.g., aluminum, copper or tungsten), such as by a metal deposition process, or other conductive materials, such as, but not limited to, polysilicon or suicides. The via 413 provides an electrical connection to the drain/source region 410. Although not shown, other conductive vias may be formed through the insulating layer 426 in a similar manner to provide electrical connections to source region 408 and drain region 412. A conductive tap 414, which may analogous to tap 318 (see FIG. 3), is then formed on an upper surface of insulating layer 426 over at least a portion of via 413, such as, for example, using a conventional metal deposition process. The tap 414 is electrically connected to the drain/source region 410 through via 413. A second insulating layer 428, which may comprise silicon dioxide ($SiO_2$) or an alternative insulating material, is then formed over the tap 414, such as, for example, using a conventional oxide deposition step.

The lower conductive plates 416, 418 are formed on an upper surface of insulating layer 428, such as, for example, using standard photolithographic patterning and etching. One or more conductive vias 432 are formed in the second insulating layer 428 in a conventional manner so as to provide an electrical connection between a second tap 430 formed on the upper surface of insulating layer 428 and tap 414 formed in a prior step. The use of more than one conductive via to connect the various levels of taps helps reduce the interconnection resistance of the taps while providing additional reliability in case one of the vias fails. A third insulating layer 436, which may comprise silicon dioxide or an alternative insulating material, is then formed substantially over the lower conductive plates 416, 418 and second tap 430 in a conventional manner.

The upper conductive plate 422 is formed on an upper surface of the third insulating layer 436, such as, for example, using standard photolithographic patterning and etching. The upper conductive plate 422 is electrically connected to the lower conductive plates 416, 418 by way of the conductive vias 420 which are formed through the third insulating layer 436. The vias 420 may be formed in a conventional manner, such as, for example, by etching respective openings through insulating layer 436 to expose at least a portion of the lower conductive plates 416, 418 and filling the openings with metal (e.g., aluminum, copper or tungsten). Likewise, one or more vias 434 are formed through the third insulating layer 436 to provide an electrical connection to a third tap 438 formed on an upper surface of insulating layer 436 and tap 430 formed in a prior processing step. The third tap 438 may be formed in a manner similar to that used to form tap 430. A fourth insulating layer 442, which may comprise silicon dioxide or an alternative insulating material, is then formed over the upper conductive plate 422 and third tap 438 in a conventional manner.

A final conductive tap 444 is formed on an upper surface of the fourth insulating layer 442 using, for example, conventional patterning and etching. The tap 444 is electrically connected to the upper conductive plate 422 at a first end using one or more conductive vias 424 formed through the fourth insulating layer 442. Likewise, tap 444 is connected at a second end to tap 438 using one or more conductive vias 440 formed through insulating layer 442.

The exemplary test circuit 300 illustrated in FIG. 3 is applicable for two-point probing, since only two buses and corresponding bond pads, namely, Pad A and Pad B, are employed. With two-point probing, current is forced and voltage is sensed through the same bond pad. It is to be appreciated, however, that the present invention is not limited to two-point probing. Rather, the techniques of the present invention as described herein may be readily expanded to other multiple-point (e.g., four-point) probing configurations, as will be understood by those skilled in the art.

Figure 5:
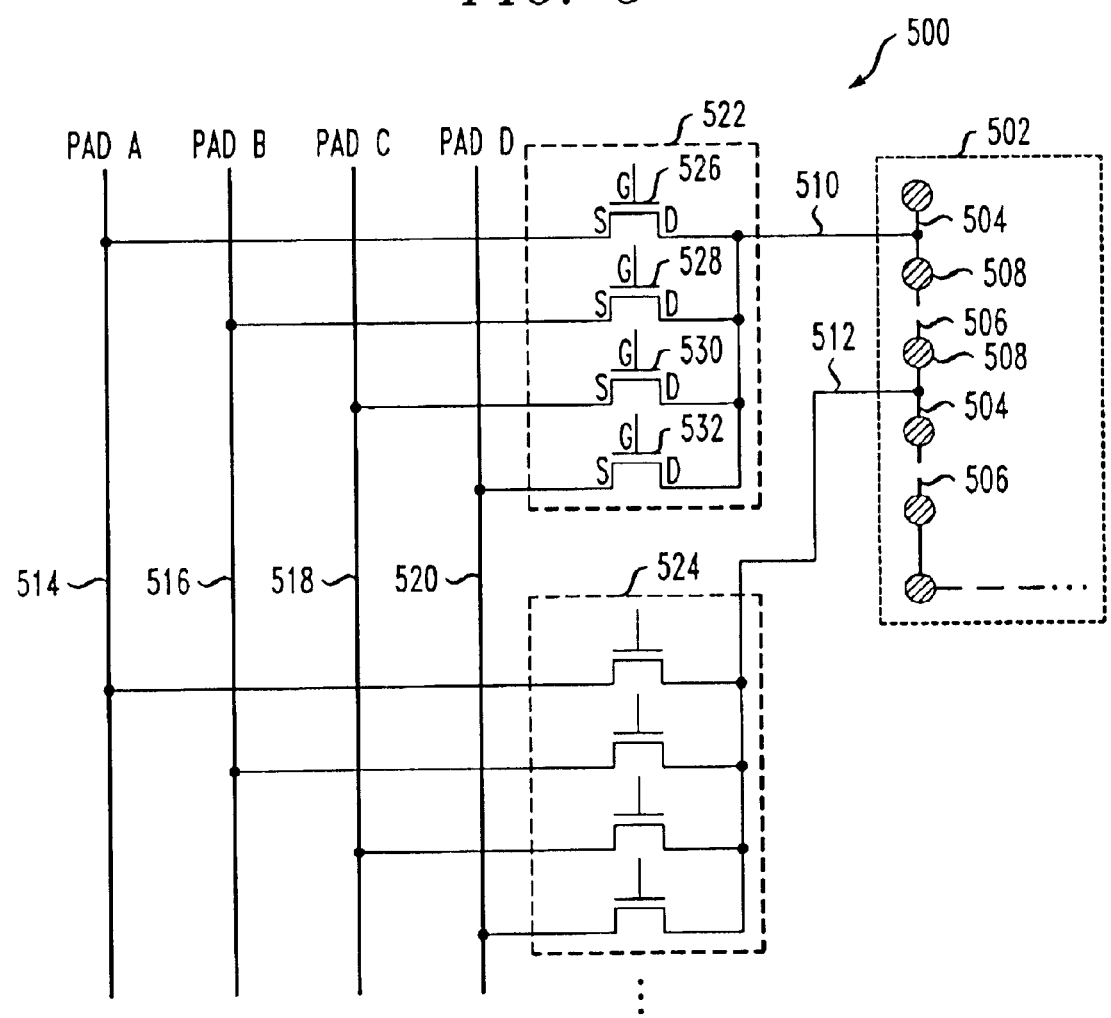
FIG. 5 is a schematic diagram illustrating at least a portion of an exemplary test circuit, formed in accordance with another embodiment of the invention.

By way of example only, FIG. 5 illustrates at least a portion of an exemplary four-point probing test circuit 500, formed in accordance with another embodiment of the invention. In a four-point probing arrangement, the test circuit is capable of forcing a current and measuring a voltage through separate bond pads. Therefore, resistance characterization data associated with the test structure may be obtained.

The exemplary test circuit 500 includes a test structure 502 which, like the test structure 302 depicted in FIG. 3, may be formed of alternating upper metal plates 504 and lower metal plates 506 connected together in a series chain by a plurality of conductive vias 508. A plurality of conductive taps 510, 512 are coupled to the test structure 502 for selectively accessing substantially all points in the chain. In a manner similar to the test circuit 300 shown in FIG. 3, each of at least a portion of the taps 510, 512 in the test circuit 500 is coupled to a corresponding switching circuit 522, 524, respectively, that is configurable for selectively connecting the tap to one of four buses 514, 516, 518 and 520. Each of the buses 514, 516, 518 and 520, is connected to a respective bond pad, namely, PAD A, PAD B, PAD C and PAD D, respectively.

The switching circuits, like for the test circuit shown in FIG. 3, may comprise a plurality of switches, one or more of which may be implemented using pass transistors as shown. Each of the switches is coupled at a first terminal to the corresponding tap and at a second terminal to one of the buses. For example, switching circuit 522 comprises pass transistors 526, 528, 530 and 532 configured such that a drain terminal of each of the transistors is coupled to tap 510 and a source terminal of transistor 526 is coupled to bus 514, a source terminal of transistor 528 is coupled to bus 516, a source terminal of transistor 530 is coupled to bus 518, and a source terminal of transistor 532 is coupled to bus 520. The pass transistors in the test circuit 500, like in test circuit 300, are preferably addressable through address lines (not shown), each of the address lines being coupled to a gate terminal of a corresponding transistor at a first end and either directly to a bond pad or to an address decoder (not shown) at a second end. As previously explained, by using an address decoder to selectively address the transistors, the data resolution obtained from the test structure can be significantly increased for a given number of bond pads.

In accordance with another aspect of the invention, the test circuit described herein may be used to obtain valuable characterization data which may be beneficial, for example, in evaluating the reliability of IC designs. As previously explained, an important benefit of the present invention is the ability to detect a failure occurring at any link in the test structure. To accomplish this, a complete measurement of all the links in the chain can be performed by scanning through each of the links within the entire chain, so that the characteristics of each link, including resistance value, etc., can be recorded. During this process, the number of defective links in the chain, along with their relative locations, can be recorded as well. This approach is superior to traditional methodologies in that using traditional methodologies it is not possible to detect the total number and relative positions of defective links.

The measurement of specific links in the chain can be carried out by selectively addressing the pass transistors in the test circuit 300, as previously described. In such instance, the measurement procedure can be targeted to certain portions of the chain as desired, without necessarily accessing the entire chain. In this manner, more extensive data collection and analysis of only those certain portions of the chain may be carried out in an expedited fashion.

In accordance with the present invention, an illustrative methodology for locating defective links in the chain may include the step of first determining if any defect exists. This can be easily done, for example, by performing a continuity measurement on the overall chain (e.g., measuring the resistance between endpoints of the chain). When a defect does exist (e.g., no continuity), a successive approximation type procedure may be performed for iteratively narrowing the exact location(s) of the defective link(s) in the chain. For example, a resistance measurement may be performed between a first end of the chain and a tap substantially representing a middle of the chain. If no defect is found in the first half of the chain, a resistance measurement can be made between the middle and a second end of the chain. When a defect is found, the process preferably continues by successively dividing the chain substantially in half until the exact location of the defect is determined. Alternative techniques for locating defective links in the chain are similarly contemplated by the invention, as will be known by those skilled in the art.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A test circuit for testing semiconductors, comprising:
   a plurality of at least first conductors and second conductors, the first and second conductors being operatively connected together by a plurality of conductive vias to form an open chain of alternating first and second conductors;
   a plurality of conductive taps, each of the taps being connected at a first end to a corresponding first conductor; and
   a plurality of switching circuits, each of the switching circuits being operatively connected to a second end of a corresponding one of the conductive taps, each of the switching circuits being configurable for selectively connecting the corresponding conductive tap to one of at least a first bus and a second bus in response to at least one control signal presented to the switching circuit, the first and second buses being connected to first and second bond pads, respectively.

2. The test circuit of claim 1, further comprising a decoder operatively coupled to the switching circuits, the decoder being configured to generate the at least one control signal for selectively accessing one or more of the plurality of first and second conductors in the chain.

3. The test circuit of claim 2, wherein the decoder comprises at least one N-to-$2^N$ line decoder, where $2^N$ is equal to a number of conductive taps to be accessed in the test circuit, the N-to-$2^N$ line decoder including N control inputs and $2^N$ outputs for generating the at least one control signal for selectively accessing one or more of the plurality of first and second conductors in the chain.

4. The test circuit of claim 2, wherein the decoder comprises at least one of a column multiplexer circuit and a row multiplexer circuit, the column multiplexer being configured to generate the at least one control signal corresponding to at least a portion of the plurality of switching circuits arranged in a substantially column dimension and the row multiplexer being configured to generate the at least one control signal corresponding to at least a portion of the plurality of switching circuits arranged in a substantially row dimension.

5. The test circuit of claim 1, wherein each of at least a portion of the switching circuits comprises a multiplexer including at least a first input coupled to the first bus, a second input coupled to the second bus, and an output coupled to a corresponding one of the conductive taps, the multiplexer being configured to electrically connect at least one of the first and second inputs to the output in response to the at least one control signal presented to the multiplexer.

6. The test circuit of claim 1, wherein each of at least a portion of the switching circuits is coupled to at least one bond pad and is selectively addressable in response to at least one corresponding control signal presented thereto.

7. The test circuit of claim 1, wherein each of at least a portion of the switching circuits comprises a pair of switches, each switch in the pair of switches including first and second terminals and a control input, each switch electrically connecting the first terminal to the second terminal in response to a signal applied to the control input, the pair of switches being connected together in series such that the first terminal of a first one of the switches is connected to the first bus, the second terminal of the first switch is connected to the first terminal of a second one of the switches, and the second terminal of the second switch is connected to the second bus.

8. The test circuit of claim 7, wherein each of at least a portion of the switches comprises a metal-oxide-semiconductor transistor including first and second drain/source terminals and a gate, the first terminal of the switch corresponding to the first drain/source terminal, the second terminal of the switch corresponding to the second drain/source terminal, and the control input of the switch corresponding to the gate.

9. The test circuit of claim 7, further comprising a decoder operatively coupled to the control input of each of at least a portion of the switches, the decoder being configured to generate the at least one control signal for selectively addressing one or more of the switches.

10. The test circuit of claim 1, wherein the test circuit is configurable for detecting a failure between any two adjacent first and second conductors in the chain.

11. The test circuit of claim 1, wherein each of at least a portion of the switching circuits is configurable for performing four-point probing by selectively connecting the corresponding conductive tap to at least one of the first bus, the second bus, a third bus and at least a fourth bus in response to the at least one control signal presented to the switching circuit, the third and fourth buses being connected to third and fourth bond pads, respectively.

12. An integrated circuit (IC) device including at least one test circuit for detecting one or more failures in the IC device, the at least one test circuit comprising:
   a plurality of at least first conductors and second conductors, the first and second conductors being operatively connected together by a plurality of conductive vias to form an open chain of alternating first and second conductors;
   a plurality of conductive taps, each of the taps being connected at a first end to a corresponding first conductor; and a plurality of switching circuits, each of the switching circuits being operatively connected to a second end of a corresponding one of the conductive taps, each of the switching circuits being configurable for selectively connecting the corresponding conductive tap to one of at least a first bus and a second bus in response to at least one control signal presented to the switching circuit, the first and second buses being connected to first and second bond pads, respectively.

13. The device of claim 12, wherein the at least one test circuit further comprises a decoder operatively coupled to the switching circuits, the decoder being configured to generate the at least one control signal for selectively accessing one or more of the plurality of first and second conductors in the chain.

14. The device of claim 13, wherein the decoder is located remotely in relation to the at least one test circuit.

15. The device of claim 12, wherein each of at least a portion of the switching circuits in the at least test circuit comprises a multiplexer including at least a first input coupled to the first bus, a second input coupled to the second bus, and an output coupled to a corresponding one of the conductive taps, the multiplexer being configured to electrically connect at least one of the first and second inputs to the output in response to the at least one control signal presented to the multiplexer.

16. The device of claim 12, wherein each of at least a portion of the switching circuits in the at least one test circuit comprises a pair of switches, each switch in the pair of switches including first and second terminals and a control input, each switch electrically connecting the first terminal to the second terminal in response to a signal applied to the control input, the pair of switches being connected together in series such that the first terminal of a first one of the switches is connected to the first bus, the second terminal of the first switch is connected to the first terminal of a second one of the switches, and the second terminal of the second switch is connected to the second bus.

17. The device of claim 16, wherein each of at least a portion of the switches comprises a metal-oxide-semiconductor transistor including first and second drain/source terminals and a gate, the first terminal of the switch corresponding to the first drain/source terminal, the second terminal of the switch corresponding to the second drain/source terminal, and the control input of the switch corresponding to the gate.

18. The device of claim 12, wherein each of at least a portion of the switching circuits in the at least one test circuit is formed below the chain of alternating first and second conductors.

19. The device of claim 12, wherein each of at least a portion of the switching circuits in the at least one test circuit is formed in close relative proximity to a corresponding one of the conductive taps.

20. The device of claim 12, wherein each of at least a portion of the switching circuits in the at least one test circuit is formed remotely in relation to the at least one test circuit.

21. The device of claim 12, wherein each of at least a portion of the switching circuits is configurable for performing four-point probing by selectively connecting the corresponding conductive tap to at least one of the first bus, the second bus, a third bus and at least a fourth bus in response to the at least one control signal presented to the switching circuit, the third and fourth buses being connected to third and fourth bond pads, respectively.

22. A method for obtaining characterization data from a semiconductor device including a test structure, the test structure comprising a plurality of at least first conductors and second conductors, the first and second conductors being operatively connected together by a plurality of conductive vias to form an open chain of alternating first and second conductors; a plurality of conductive taps, each of the taps being connected at a first end to a corresponding first conductor; and a plurality of switching circuits, each of the switching circuits being operatively connected to a second end of a corresponding one of the conductive taps, each of the switching circuits being configurable for selectively connecting the corresponding conductive tap to one of at least a first bus and a second bus in response to at least one control signal presented to the switching circuit, the first and second buses being connected to first and second bond pads, respectively, the method comprising the steps of:

measuring at least a resistance of each of at least a portion of the first and second conductors in the chain; and determining, based at least in part on the resistance measurements, at least one of a number of defects in the chain and a location of one or more defects in the chain.

23. The method of claim 22, wherein the step of measuring the resistance of each of at least a portion of the first and second conductors comprises selectively enabling the switching circuits corresponding to the conductive taps associated with a given one of the first and second conductors in the chain.

24. The method of claim 22, further comprising the step of storing at least one of one or more of the resistance measurements, the number of defects in the chain, and the location of the one or more defects in the chain.

* * * * *